US008120390B1

(12) United States Patent

Mack

(10) Patent No.: US 8,120,390 B1

(45) Date of Patent: Feb. 21, 2012

(54) CONFIGURABLE LOW DROP OUT REGULATOR CIRCUIT

(75) Inventor: Michael Peter Mack, Sunnyvale, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 434 days.

(21) Appl. No.: 12/407,747

(22) Filed: Mar. 19, 2009

(51) Int. Cl.
*H03B 1/00* (2006.01)

(52) U.S. Cl. ......................... 327/108; 327/109; 327/111

(58) Field of Classification Search .................. 327/108, 327/109, 111, 541, 537; 323/317
See application file for complete search history.

(56) References Cited

U.S. PATENT DOCUMENTS 7,863,969 B2 * 1/2011 Furuya et al. ................ 327/541

* cited by examiner

*Primary Examiner* — Shawn Riley

(74) *Attorney, Agent, or Firm* — Bever, Hoffman & Harms, LLP

(57) ABSTRACT

A low drop out voltage regulator (LDO) is capable of operating in one of two different modes based on externally connected components. In one mode, the LDO directly generates a regulated output voltage. In a second mode, the LDO drives an external PNP transistor to generate a regulated output voltage. In both modes, a relatively large bypass capacitor may be connected to the output voltage node to bypass high-frequency loading on the output voltage node. However, the bypass capacitor creates a low frequency pole in the frequency response of the LDO, which can diminish phase margin and reduce overall stability. An on chip compensation network beneficially counteracts the low frequency pole with an appropriately placed zero, thereby resulting in improved phase margin and greater stability.

19 Claims, 6 Drawing Sheets

CONFIGURABLE LOW DROP OUT REGULATOR CIRCUIT

BACKGROUND OF THE INVENTION

1. Field of the Invention

Embodiments of the present invention generally relate to voltage regulator circuits, and more specifically to a configurable low drop out regulator circuit.

2. Description of the Related Art

Many electronic systems include sets of circuitry that require one or more regulated voltage sources configured to generate specific respective voltages. For example, an electronic system may include a set of circuitry that requires a regulated voltage source of 1.2V, another set of circuitry that requires a regulated voltage source of 3.3V, and yet another set of circuitry that requires a regulated 5V voltage source. An electronic system may also require two distinct voltages sources of 1.2V in order to isolate sensitive circuits from noisy circuits. Each set of circuitry that requires a specific voltage may operate from a common voltage source, or from independent voltage sources that are configured to supply a nominally equivalent voltage. Each voltage source is also configured to source (or sink) a specific maximum current. For example, the 1.2V voltage source may be configured to source up to one ampere, while the 3.3V voltage source may be configured to source up to only 50 milliamps.

One popular type of voltage supply is a low drop out (LDO) regulator circuit or simply "LDO." An LDO typically includes a voltage drop element disposed between a voltage source and an LDO output node, which supplies a system element with a specified voltage. Control circuitry within the LDO adjusts the voltage drop element in response to dynamic loading of the LDO output node to generate a constant voltage on the LDO output node. A conventional LDO is designed to use a specific voltage drop element that is disposed either on chip or off chip.

As electronic systems become more complex, each integrated circuit within a given system is typically designed to incorporate an increasing number of different system functions, including circuits that function as regulated voltage sources. LDOs are commonly used in this setting for low to moderate current applications. A multi-function integrated circuit typically includes a plurality of such voltage sources, wherein each voltage source is separately designed assuming a specific overall system configuration. For example, a system may require a certain number of low current voltage supplies and one or more high current voltage supplies. In this scenario, a multi-function integrated circuit may include a set of on-chip LDOs specifically configured to act as direct output regulators, capable of supplying low to modest current at a regulated voltage. The multi-function integrated circuit may also include one or more LDOs specifically configured to act as control regulators for an associated external transistor capable of supplying relatively high current. Each specifically optimized LDO represents a costly engineering effort and is conventionally designed to only operate in a specific mode. If the LDOs need to operate in a different mode than originally envisioned, then either a different multi-function integrated circuit needs to be developed and manufactured to implement the required set of LDOs or external power supplies need to be added to the system. Either option may add significant expense to the system.

As the foregoing illustrates, what is needed in the art is a configurable LDO circuit capable of adapting to changing system requirements without requiring a re-design.

SUMMARY OF THE INVENTION

One embodiment of the present invention sets forth a voltage regulator circuit operable in a direct output mode and a control mode. The regulator circuit comprises an operational amplifier configured to amplify a differential voltage input, a bias generator configured to generate at least one bias voltage and transmit the at least one bias voltage to the operational amplifier, and a compensation network configured to introduce a pole and a zero in a frequency response for the operational amplifier. The regulator circuit further comprises a follower gain stage configured to amplify voltage swing and generate a control output.

In a first operating mode, the voltage regulator circuit provides a direct regulated output voltage. In a second operating mode, the voltage regulator circuit controls an off chip PNP bipolar junction transistor or p-channel MOSFET transistor to generate a regulated output voltage.

One advantage of the disclosed invention is that a single design for a voltage regulator circuit may be configured at a circuit board level to adapt to changing system needs, thereby saving cost and engineering effort.

DETAILED DESCRIPTION

Figure 1A:
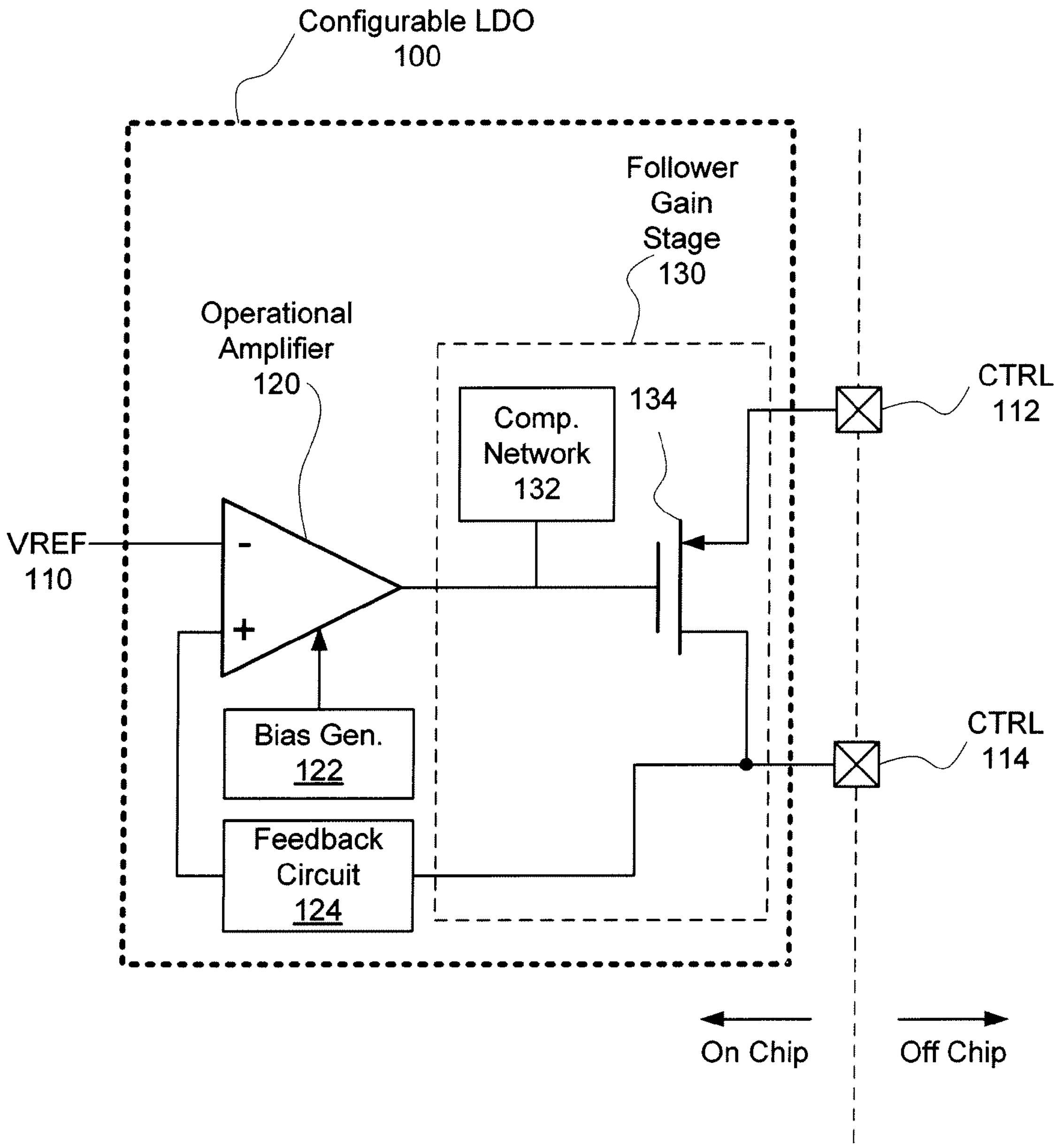
FIG. 1A is a block diagram of a configurable low drop out regulator.

FIG. 1A is a block diagram of a configurable low drop out regulator (LDO) 100. The configurable LDO 100 receives a reference voltage, VREF 110, and presents two control nodes, CTRL 112 and CTRL 114. In one embodiment, VREF 110 is generated on chip, and the two control nodes CTRL 112 and CTRL 114 are presented to off chip circuitry. For example, control nodes CTRL 112 and CTRL 114 may be bonded to a package level input/output pin. In an alternative embodiment, one or both of the control nodes CTRL 112, CTRL 114 are connected to on chip circuitry. For example, CTRL 112 may be connected to a positive supply (VDD) node either directly on chip, or through a bonding configuration internal to a respective package.

The configurable LDO 100 comprises an operational amplifier 120, a follower gain stage 130, a bias generator 122, and a feedback circuit 124. The follower gain stage 130 comprises a p-channel metal-oxide semiconductor (P-MOS) transistor M1 134 and a compensation network 132.

The operational amplifier 120 amplifies a differential voltage applied to two inputs, labeled "+" for positive input and "–" for negative input. A positive differential voltage is present when a difference voltage between a voltage applied to the positive input negative a voltage applied to the negative input is a positive value. A negative differential voltage is present when the difference voltage between the voltage applied to the positive input minus the voltage applied to the negative input is a negative value. A bias generator 122 provides at least one bias voltage to the operational amplifier 120 to establish an operational bias point within the operational amplifier 120. Persons skilled in the art will understand that a trade-off relationship exists between the bias point of the operational amplifier 120 and an associated transconductance for the operational amplifier 120. In one embodiment, the bias generator 122 is referenced to VREF 110.

The output of the operational amplifier 120 drives the compensation network 132, and the PMOS transistor 134. The compensation network 132 includes at least one pole and at least one zero selected to enable a stable negative feedback loop from CRTL 114, through feedback circuit 124 to the positive input of operational amplifier 120 (which completes the feedback loop). In one embodiment, the feedback circuit 124 may comprise a resistor. This feedback loop is configured to operate in a negative-feedback mode because transistor 134 provides a negative magnitude gain within the feedback loop. The compensation network 132 may include resistor elements and capacitor elements selected to nominally place the at least one pole and the at least one zero in the frequency response of the feedback loop for stable operation of the feedback loop. Stable operation is conventionally achieved when a phase of the feedback signal is negative for all frequencies lower than a characteristic unity gain frequency of the feedback signal. The unity gain frequency defines a frequency above which an amplifier imparts a loss in feedback signal magnitude rather than a gain in feedback signal magnitude. Additional positive phase shift phase shift comprises "phase margin," which generally implies greater feedback loop stability.

Conventional resistor and capacitor elements typically vary with temperature and process, thereby moving the at least one pole and the at least one zero in frequency. This movement may create an unstable feedback loop, wherein a pole located below the unity gain frequency may cause the phase of the feedback loop to pass through zero phase. To mitigate potential unstable operation of the feedback loop, the at least one zero is included within the compensation network 132 to introduce a positive phase shift, which adds positive phase margin. Furthermore, the bias generator 122 and compensation network 132 are configured to establish a relatively constant relationship between the input stage transconductance and the inverse of the resistance in the compensation network 132 to reduce the effect of process and temperature variations on the unity gain bandwidth and phase margin of the feedback loop.

Figure 1B:
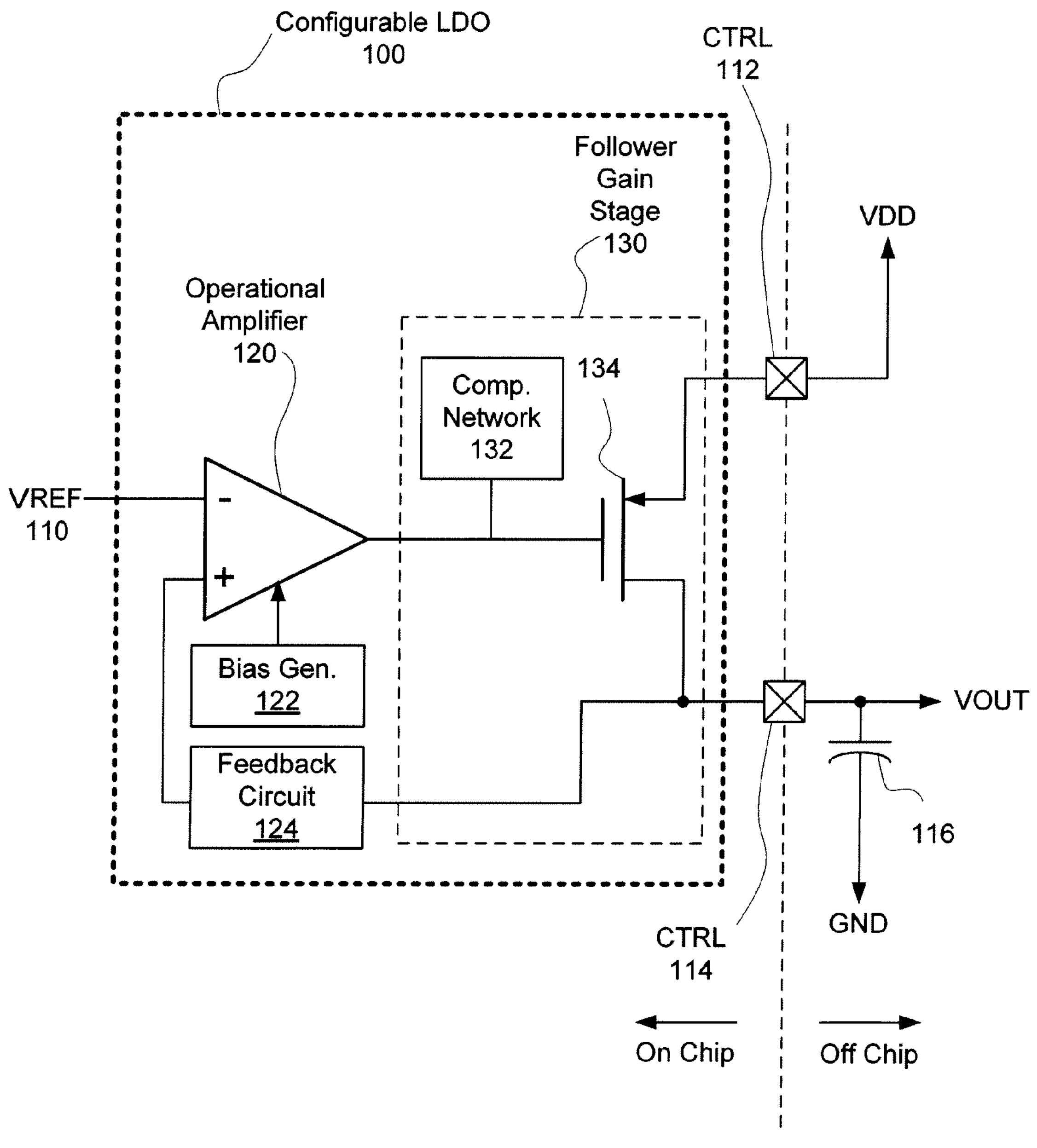
FIG. 1B illustrates the configurable low drop out regulator operating in direct output mode.

FIG. 1B illustrates the configurable low drop out regulator (LDO) 100 operating in direct output mode. In this mode, transistor 134 is configured to act as a common source amplifier by connecting the CTRL node 112 to a positive supply (VDD), for example, through an input/output pin. A regulated output voltage VOUT is available directly from the CTRL node 114. A capacitor 116 should be connected between the CTRL node 114 and a ground node (GND). In this configuration, capacitor 116 serves as both a source and sink of high frequency current that may be required by a load operating from VOUT. In this mode, capacitor 116 and the compensation network 132 may be configured to achieve stable operation of the amplifier with the desired unity gain feedback. In one embodiment, capacitor 116 is generally in a range of 1 microfarad to 3.3 microfarads.

Figure 1C:
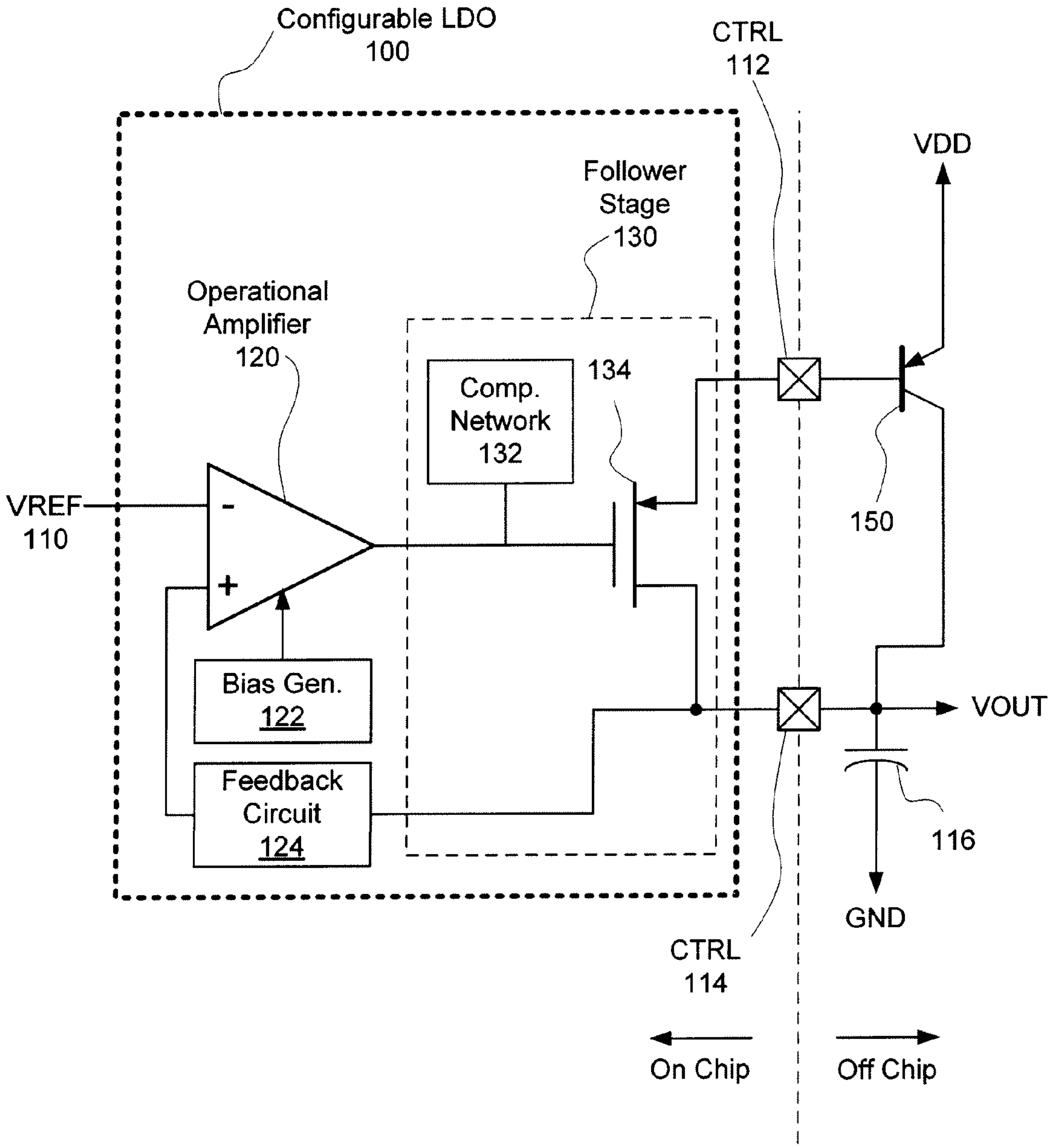
FIG. 1C illustrates the configurable low drop out regulator operating in control regulator mode.

FIG. 1C illustrates the configurable low drop out regulator 100 operating in control regulator mode. In this mode, transistor 134 is configured to act as a first stage of a common emitter Darlington amplifier, with a PNP type bipolar junction transistor (BJT) 150 configured to act as a second (current driver) stage to provide a regulated output voltage VOUT with a current sourcing capacity defined by the PNP BJT 150. In one embodiment, the PNP BJT 150 is an off chip device capable of sourcing more current than the on chip transistor 134.

In this configuration, CTRL node 112 is connected to a base node of the PNP BJT 150. An emitter pin of the PNP BJT 150 is connected to the positive supply (VDD). A collector pin of the PNP BJT 150 is connected to the CTRL node 114, which comprises an output node for a regulated output voltage VOUT. Capacitor 116 serves as both a source and sink of high frequency current that may be required by a load operating from VOUT. In this mode, capacitor 116 should be selected to achieve stable operation of the amplifier with the desired unity gain feedback using the compensation network 132 configured to compensate the LDO in the direct configuration. The value of capacitor 116 can be significantly higher when PNP BJT 150 is used because the resulting Darlington stage typically increases the total gain of the amplifier. In one embodiment, capacitor 116 is generally in a range of 10 microfarads to 33 microfarads.

In both the direct output mode illustrated in FIG. 1B and the control regulator mode shown in FIG. 1C, capacitor 116 introduces a low frequency pole in the frequency response of the feedback loop. Persons skilled in the art will recognize that this low frequency pole has the effect of driving the feedback phase towards zero phase, at which point the feedback loop would become unstable. The zero within the compensation network 132 has the effect of counteracting this low frequency pole by driving the phase towards a 180 degree (away from zero degrees).

Figure 2:
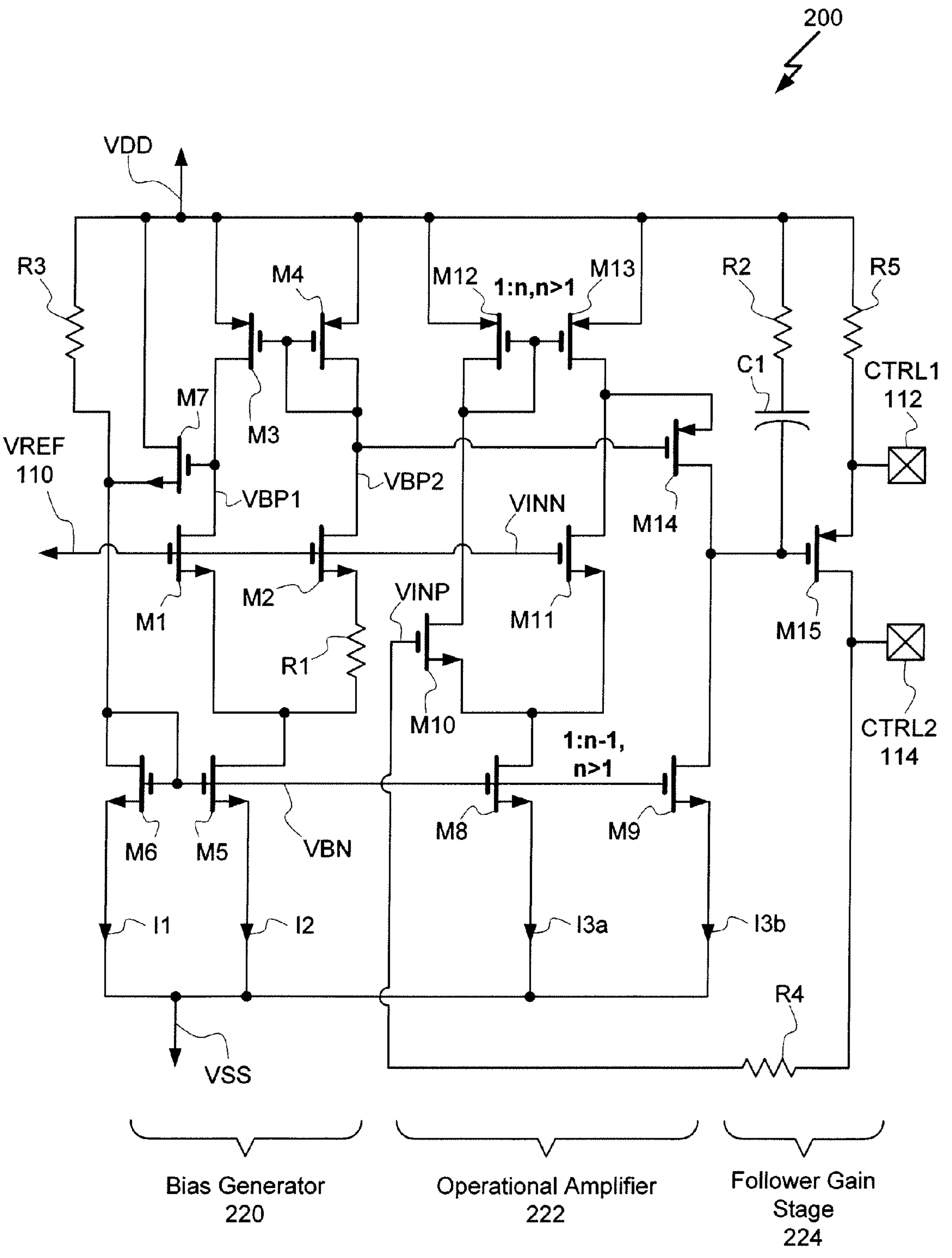
FIG. 2 illustrates one embodiment of the configurable low drop out regulator circuit using complementary metal oxide semiconductor devices.

FIG. 2 illustrates one embodiment of the configurable low drop out regulator circuit 200 using complementary symmetry metal oxide semiconductor (CMOS) devices. The configurable LDO 200 comprises a bias generator 220, an operational amplifier 222, and a follower gain stage 224. The configurable LDO 200 receives a reference voltage VREF 110, corresponding to VREF 110 of FIG. 1A, and presents CTRL node 112 and CTRL node 114.

The bias generator 220 includes two p-channel metal-oxide semiconductor (P-MOS) transistors M3, M4, five n-channel metal-oxide semiconductor (N-MOS) transistors M1, M2, M5, M6, M7, and two resistors R3 and R1.

Resistor R3 serves to start current flow within transistor M6 to establish current i1 on power up. As resistor R3 pulls up the drain node of transistor M6 and current i1 to begins to increase, transistor M7 begins conducting and serves as a primary path from positive supply VDD through transistor M6 to negative supply VSS. In one embodiment, resistor R3 comprises a poly-silicon resistor. Current i1 is mirrored through bias voltage VBN to determine a drain current i2 for transistor M5. Current i2 is split between a first path that includes transistors M1 and M3, and a second path through transistors M2 and M4. P-MOS transistors M3 and M4 form a bias structure that generates bias voltage VBP1 and VBP2. This arrangement causes the current i2 through transistor M5 to vary such that the transconductance in transistor M1 is inversely proportional to the resistor R1.

The operational amplifier 222 comprises a differential amplifier structure including input transistors M10 and M11, paired with transistors M12, M13, respectively, and transistor M8, which is used to determine an operating current i3*a* for the differential amplifier structure. In one embodiment, the transistor M12 to M13 size ratio is 1:n, and the transistor M8 to M9 size ratio is 1:n−1, where n>1. Current i3*a* is determined by mirroring i1 through bias voltage VBN to control transistor M8. Current i3*a* is split between a first path that includes transistors M10 and M12, and a second path that includes transistors M11 and M13. Node VINN corresponds to a negative input of the operational amplifier 222 and is connected to input reference voltage VREF 110. Node VINP corresponds to a positive input of the operational amplifier 222 and is connected to feedback resistor R4, which provides a feedback path from CTRL node 114. In addition to providing a feedback path for normal operation of the configurable LDO 200, resistor R4 also serves to mitigate current spikes, for example due to electrostatic discharge during manufacturing and handling, from damaging on chip circuit elements such as M10.

Current i3*b* is determined by mirroring i1 through bias voltage VBN to control transistor M9. Transistors M14 and M9 form an output stage that enables the operational amplifier 222 to drive a wider output voltage swing.

The follower gain stage 224 comprises P-MOS transistor M15, and resistor R5. In one embodiment, the resistor R5 may be replaced with a transistor current source. The compensation network 132 of FIGS. 1A-1C comprises capacitor C1 and resistor R2. Capacitor C1 and resistor R2 introduce a zero in the frequency response of the feedback loop that includes the operational amplifier 222, the follower gain stage 224 and a feedback circuit, such as feedback resistor R4. When a bypass capacitor, such as capacitor C 116 of FIGS. 1B and 1C, is attached to CTRL node 114, the bypass capacitor introduces a low frequency pole in the feedback loop. This low frequency pole drives the phase of the feedback loop to tend negative at higher frequencies. However, the zero introduced by the compensation network 132 serves to drive the feedback loop phase positive, thereby improving phase margin and stability.

Persons skilled in the art will recognize that the small signal transfer function of the operational amplifier 222 in a range of frequencies higher than the compensation zero but lower than any subsequent parasitic poles is a function of the values of resistors R1 and R2; specifically, the ratio of resistance values of resistors R1 and R2. By fabricating resistors R1 and R2 from the same material, for example poly-silicon, the ratio of resistors R1 to R2 is held relatively constant over temperature and process variation.

Figure 3A:
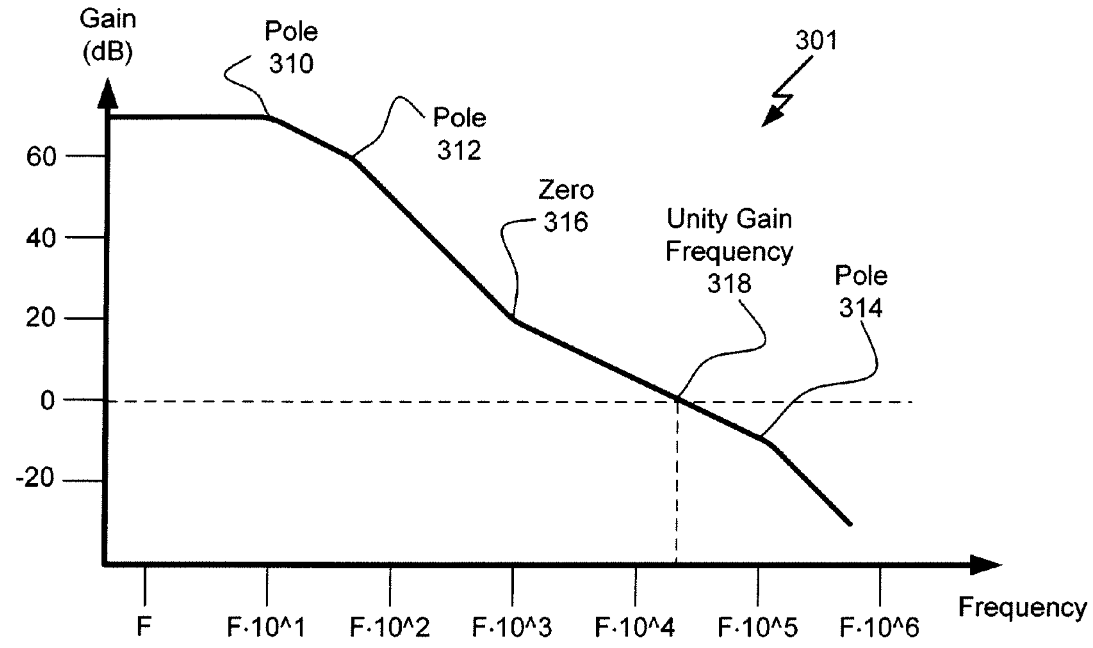
FIG. 3A illustrates an exemplary gain function of frequency in amplification stages of the configurable low drop out regulator circuit.

FIG. 3A illustrates an exemplary gain function of frequency 301 in amplification stages of the configurable low drop out regulator circuit. A horizontal axis depicts frequency along a logarithmic scale, while a vertical axis depicts gain in terms of decibels (dB). In this example, two low frequency poles 310, 312 result in a gain slope of −40 dB per decade. A zero 316 located above pole 312 in frequency adds 20 dB per decade of gain to yield a gain slope to −20 dB per decade. A high frequency pole 314 adds −20 dB per decade of gain for a net gain of −40 dB per decade passing through a unity gain frequency 318.

Figure 3B:
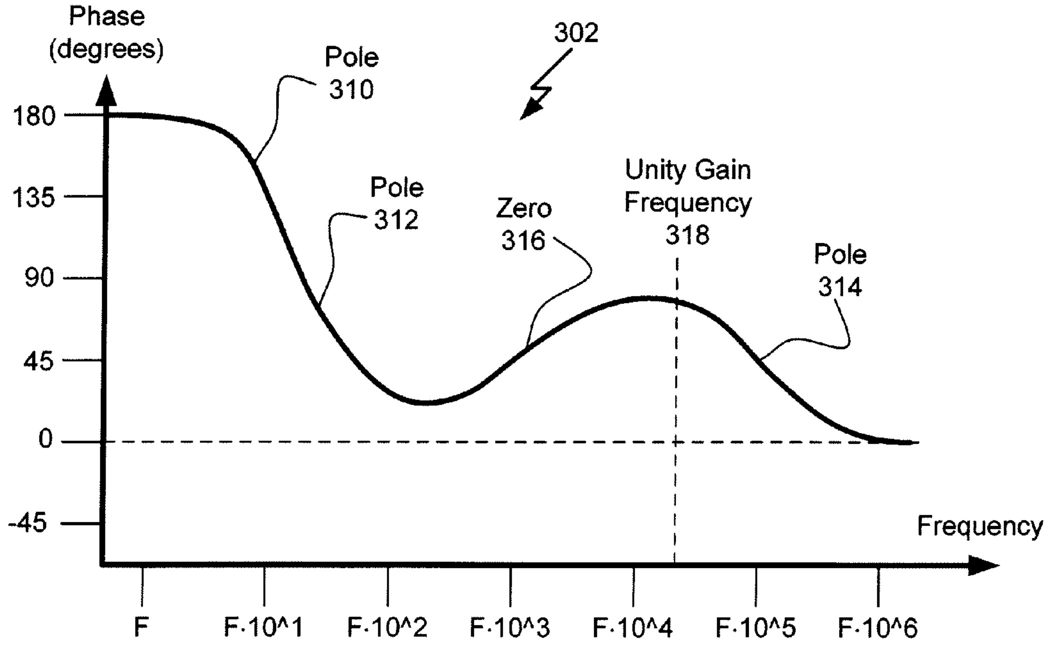
FIG. 3B illustrates an exemplary phase function of frequency in amplification stages of the configurable low drop out regulator circuit.

FIG. 3B illustrates an exemplary phase function of frequency 302 in amplification stages of the configurable low drop out regulator circuit. A horizontal axis depicts frequency along a logarithmic scale, while a vertical axis depicts phase shift of the feedback signal with respect to an input in terms of degrees. The two low frequency poles 310, 312 of FIG. 3A cause the phase to trend from +180 degrees towards zero degrees. However, the zero 316 causes the phase to trend back up to 90 degrees. The high frequency pole 314 causes the phase to, once again, trend to zero. Stable operation is maintained provided there is sufficient phase margin for input frequencies below the unity gain frequency 318. The capacitor 116 from FIGS. 1B and 1C is important as a source of high frequency current at VOUT, however capacitor 116 also adds a low frequency pole (either pole 310 or 312), which has the effect of reducing overall phase margin. To compensate for this low frequency pole, a compensation network, such as compensation network 132 of FIGS. 1A-1C, is used to introduce zero 316. The compensation network is implemented as capacitor C1 and resistor R2 of FIG. 2. Using conventional analysis and design techniques, persons skilled in the art will be able to select values for capacitor C1, resistor R1, and resistor R2 that appropriately place the zero 316 and unity gain bandwidth 318 to compensate for the low frequency pole introduced by capacitor 116 in both configurations of the LDO.

Figure 4:
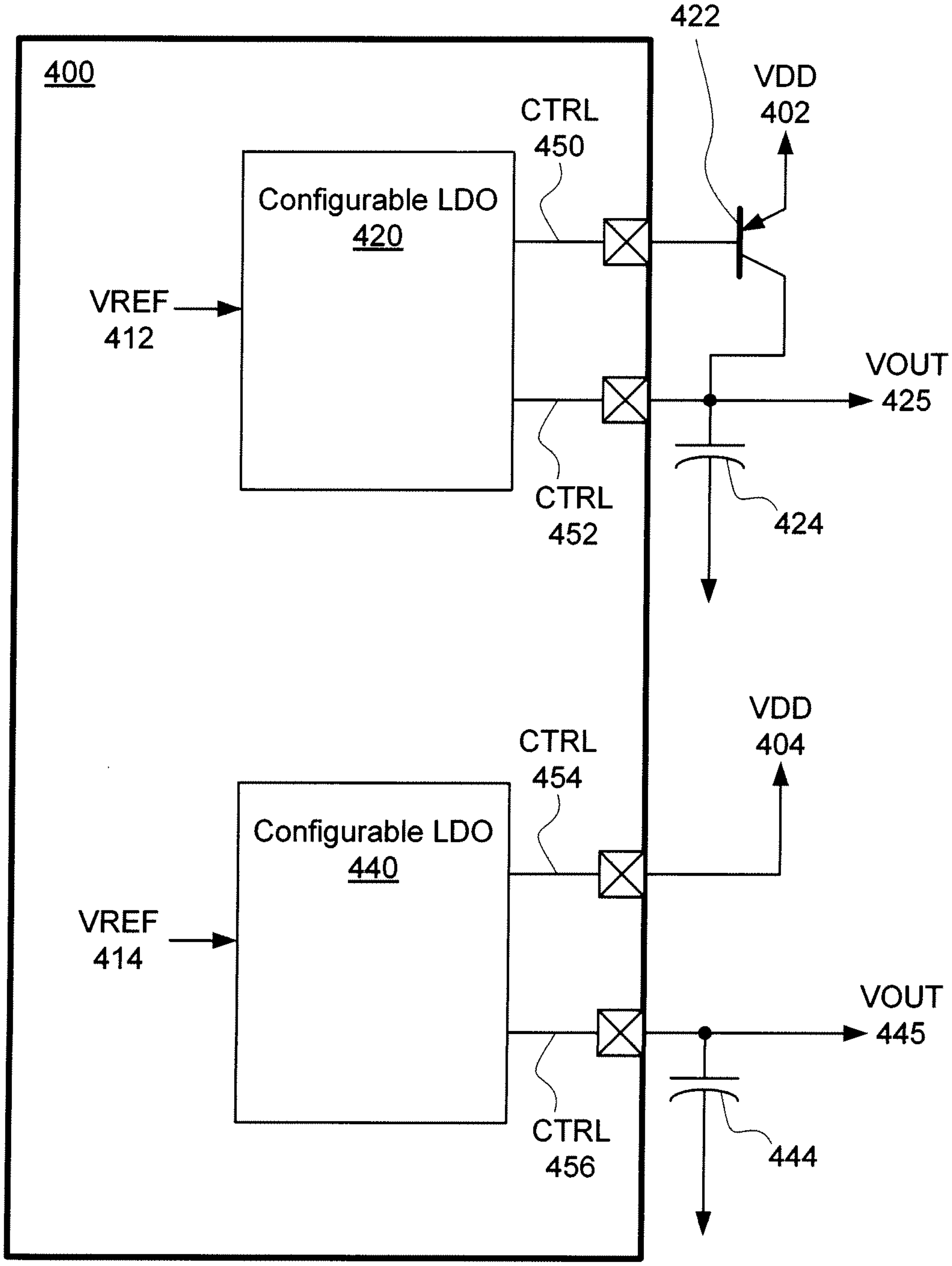
FIG. 4 illustrates an exemplary integrated circuit that includes two instances of the configurable low drop out regulator circuit, wherein each instance is configured to operate in one of two different modes.

FIG. 4 illustrates an exemplary integrated circuit 400 including two instances of the configurable LDO 200 of FIG. 2 (i.e. LDOs 420, 420) configured to operate different modes. As shown, LDO 420 is configured to operate in control regulator mode (described in reference to FIG. 1C). A reference voltage VREF 412 is connected to LDO 420. A base node of PNP BJT 422 is connected to CTRL node 450. An emitter node of PNP BJT 422 is connected to a positive supply VDD 402. A collector node of PNP BJT 422 is connected to CTRL node 452, which drives VOUT 425. VOUT 425 is a regulated output voltage node, to which electrical loads may be attached. A bypass capacitor 424 provides high-frequency energy to loads attached to VOUT 425. LDO 420 determines a voltage for VOUT 425 based on reference voltage VREF 412. As shown, LDO 440 is configured to operate in direct output mode (described in reference to FIG. 1B). A positive supply VDD 404 is connected to CTRL node 454, and a bypass capacitor 444 is connected to CTRL node 456, which is connected to VOUT 445. In one embodiment, LDO 420 and LDO 440 may be nominally identical copies of configurable LDO 200, wherein each copy may be customized according to connections on a circuit board without further customization within integrated circuit 400.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A voltage regulator circuit operable in a direct output mode and a control mode, the regulator circuit comprising:

an operational amplifier configured to generate a first voltage on a first output node based on a voltage difference between a first input node and a second input node, wherein the first input node is connected to a voltage reference;

a bias generator configured to generate at least one bias voltage and couple the at least one bias voltage to the operational amplifier, wherein the bias generator includes a first resistor for determining the at least one bias voltage;

a follower gain stage configured to receive the first voltage and generate a second voltage on a second output node that follows the first voltage; and a feedback circuit disposed between the second output node and the second input node, wherein the follower gain stage comprises a compensation network configured to introduce a zero in a frequency response associated with the first voltage, wherein the compensation network includes a second resistor composed of material matching the first resistor.

2. A voltage regulator circuit operable in a direct output mode and a control mode, the regulator circuit comprising:

an operational amplifier configured to generate a first voltage on a first output node based on a voltage difference between a first input node and a second input node, wherein the first input node is connected to a voltage reference;

a bias generator configured to generate at least one bias voltage and couple the at least one bias voltage to the operational amplifier, wherein the bias generator includes a first resistor for determining the at least one bias voltage;

a follower gain stage configured to receive the first voltage and generate a second voltage on a second output node that follows the first voltage; and a feedback circuit disposed between the second output node and the second input node, wherein the operational amplifier comprises:

a first p-channel metal-oxide semiconductor (P-MOS) transistor coupled to a positive supply node and to a first n-channel metal-oxide semiconductor (N-MOS) transistor that is further coupled to the second input node and to a second N-MOS transistor, the second N-MOS transistor being coupled to a negative supply node, wherein a voltage on the second input node determines a first current that follows a first path through the first P-MOS transistor, the first N-MOS transistor, and the second N-MOS transistor; and a second P-MOS transistor coupled to the positive supply node and to a third N-MOS transistor via a third output node, the third N-MOS transistor being further coupled to the first input node and to the second N-MOS transistor, wherein a voltage on the first input node determines a voltage on the third output node as a function of the first current and a second current that follows a second path through the second P-MOS transistor, the third N-MOS transistor, and the second N-MOS transistor, and wherein differential voltage amplification is effected through a difference between the first current and the second current.

3. The voltage regulator circuit of claim 2, wherein the operational amplifier further comprises a third P-MOS transistor coupled to a first bias node and to the first output node and to a fourth N-MOS transistor that is coupled to the negative supply node, wherein the third P-MOS transistor and fourth N-MOS transistor are configured to amplify a voltage swing on the third output node to generate a voltage swing on the first output node.

4. The voltage regulator circuit of claim 3, wherein the bias generator comprises:

a fourth P-MOS transistor coupled to the positive supply node and to a fifth N-MOS transistor and to the first bias node, the fifth N-MOS transistor being coupled to the negative supply node via the first resistor and a sixth N-MOS transistor that is coupled to a third bias node, wherein a reference voltage coupled to the fifth N-MOS transistor determines a voltage for the first bias node as a function of a third current that follows a third path through the fourth P-MOS transistor, the fifth N-MOS transistor, the first resistor, and the sixth N-MOS transistor; and a fifth P-MOS transistor coupled to the positive supply node and to a seventh N-MOS transistor and to a second bias node, the seventh N-MOS transistor being coupled to the negative supply node via the sixth N-MOS transistor, wherein the reference voltage coupled to the seventh N-MOS transistor determines a voltage for the second bias node as a function of a fourth current that follows a fourth path through the fifth P-MOS transistor, the seventh N-MOS transistor, and the sixth N-MOS transistor.

5. The voltage regulator circuit of claim 4, wherein the bias generator further comprises a sixth P-MOS transistor coupled to the positive supply node and to the second bias node and to an eighth N-MOS transistor via a first intermediate node, the N-MOS transistor being further coupled to the negative supply node and to the third bias node, wherein the sixth P-MOS transistor and the eighth N-MOS transistor are configured to generate a third bias voltage on the third bias node.

6. The voltage regulator circuit of claim 5, wherein the bias generator further comprises a third resistor configured to pull the first intermediate node to the positive supply node.

7. The voltage regulator circuit of claim 6, wherein the third resistor comprises a poly-silicon resistor.

8. A voltage regulator circuit operable in a direct output mode and a control mode, the regulator circuit comprising:

an operational amplifier configured to generate a first voltage on a first output node based on a voltage difference between a first input node and a second input node, wherein the first input node is connected to a voltage reference;

a bias generator configured to generate at least one bias voltage and couple the at least one bias voltage to the operational amplifier, wherein the bias generator includes a first resistor for determining the at least one bias voltage;

a follower gain stage configured to receive the first voltage and generate a second voltage on a second output node that follows the first voltage; and a feedback circuit disposed between the second output node and the second input node, wherein the compensation network comprises a second resistor coupled to a positive supply node and to a first capacitor that is further coupled to the first output node, the second resistor and the first capacitor introducing a zero in a frequency response of a feedback loop including the operational amplifier, the follower gain stage, and the feedback circuit.

9. The voltage regulator circuit of claim 8, wherein the first resistor and the second resistor comprise poly-silicon resistors.

10. A voltage regulator circuit operable in a direct output mode and a control mode, the regulator circuit comprising:

an operational amplifier configured to generate a first voltage on a first output node based on a voltage difference between a first input node and a second input node, wherein the first input node is connected to a voltage reference;

a bias generator configured to generate at least one bias voltage and couple the at least one bias voltage to the operational amplifier, wherein the bias generator includes a first resistor for determining the at least one bias voltage;

a follower gain stage configured to receive the first voltage and generate a second voltage on a second output node that follows the first voltage; and a feedback circuit disposed between the second output node and the second input node, wherein the follower gain stage comprises a seventh P-MOS transistor coupled to a fourth output node, the first output node, and the second output node, wherein the fourth output node and the second output node are further coupled to output pins accessible to off chip circuitry.

11. The voltage regulator circuit of claim 10, wherein the seventh P-MOS transistor is configured to operate as a common source amplifier when the fourth output node is coupled to a positive supply source and the second output node is coupled to a bypass capacitor.

12. The voltage regulator circuit of claim 10, wherein the seventh P-MOS transistor is configured to operate as a first stage in a Darlington amplifier when the fourth output node is coupled to a PNP type bipolar junction transistor and the second output node is coupled to a bypass capacitor.

13. The voltage regulator circuit of claim 10, wherein the feedback circuit comprises a poly-silicon resistor.

14. A system configured to provide at least one regulated voltage source, the system comprising:

an integrated circuit including a voltage regulator circuit, the regulator circuit comprising:

an operational amplifier configured to generate a first voltage on a first output node based on a voltage difference between a first input node and a second input node, wherein the first input node is connected to a voltage reference;

a bias generator configured to generate at least one bias voltage and transmit the at least one bias voltage to the operational amplifier, wherein the bias generator includes a first resistor for determining the at least one bias voltage;

a compensation network configured to introduce a zero in a frequency response associated with the first voltage, wherein the compensation network includes a second resistor composed of material matching the first resistor;

a follower gain stage configured to receive the first output voltage and generate a second output voltage on a second output node that follows the first voltage; and a feedback circuit disposed between the second output node and the second input node, wherein the follower gain stage comprises a compensation network configured to introduce a zero in a frequency response associated with the first voltage, wherein the compensation network includes a second resistor composed of material matching the first resistor.

15. The system of claim 14, wherein the follower gain stage comprises a first P-MOS transistor coupled to the first output node, the second output node, and a third output node.

16. The system claim 15, wherein the first P-MOS transistor is configured to operate as a common source amplifier when the third output node is coupled to a positive supply source and the second output node is coupled to a bypass capacitor.

17. The system claim 16, wherein the bypass capacitor capacitance value is within a range of one microfarad to three and three tenths microfarads.

18. The system claim 15, wherein the first P-MOS transistor is configured to operate as a first stage in a Darlington amplifier when the third output node is coupled to a PNP type bipolar junction transistor and the second output node is coupled to a bypass capacitor.

19. The system claim 18, wherein the bypass capacitor capacitance value is within a range of ten microfarads to thirty-three microfarads.

* * * * *